US012638505B2

(12) United States Patent
Qiu et al.

(10) Patent No.: US 12,638,505 B2
(45) Date of Patent: May 26, 2026

(54) DEVICE FOR TESTING FUNCTION OF CONTACTORS AND APPARATUS FOR PERFORMING ELEVATOR FUNCTION

(71) Applicant: Otis Elevator Company, Farmington, CT (US)

(72) Inventors: Heping Qiu, Shanghai (CN); Tongqiu Liu, Shanghai (CN); Ming Yin, Shanghai (CN); Tingting Wang, Shanghai (CN); Hongliang Tian, Shanghai (CN); Guoping Pan, Shanghai (CN); Baoxiang Cen, Shanghai (CN); Longwen Wang, Shanghai (CN); Lan Wang, Shanghai (CN)

(73) Assignee: OTIS ELEVATOR COMPANY, Farmington, CT (US)

( * ) Notice: Subject to any disclaimer, the term of this patent is extended or adjusted under 35 U.S.C. 154(b) by 231 days.

(21) Appl. No.: 18/388,439

(22) Filed: Nov. 9, 2023

(65) Prior Publication Data

US 2024/0230760 A1    Jul. 11, 2024

(30) Foreign Application Priority Data

Jan. 11, 2023    (CN) ........................ 202310072170.X

(51) Int. Cl.
*G01R 31/327* (2006.01)
*B66B 5/02* (2006.01)
(Continued)

(52) U.S. Cl.
CPC ............ *G01R 31/3277* (2013.01); *B66B 5/02* (2013.01); *G01R 19/257* (2013.01); *H02P 3/22* (2013.01)

(58) Field of Classification Search
CPC .............. G01R 31/327; G01R 31/3277; G01R 19/257; G01R 19/165; G01R 19/16528;
(Continued)

(56) References Cited

U.S. PATENT DOCUMENTS 5,563,489 A    10/1996  Murry
7,130,170 B2    10/2006  Wakefield et al.
(Continued)

FOREIGN PATENT DOCUMENTS

CN    100502222 C    6/2009
CN    101134544 B    6/2010
(Continued)

*Primary Examiner* — Son T Le
(74) *Attorney, Agent, or Firm* — CANTOR COLBURN LLP

(57) ABSTRACT

A device for detecting a function of a contactor, the contactor is configured to short three-phase phase lines of an elevator motor together by closing contacts, the device including: a voltage signal source coupled with the contactor; a voltage detection unit coupled with the three-phase phase lines of the elevator motor; a switching unit arranged between the contactor and the voltage signal source and between the voltage detection unit and the three-phase phase lines, in a detection mode, the switching unit is configured to conduct the voltage signal source to the contactor to provide a voltage detection signal to the three-phase phase lines via the contactor and to conduct the voltage detection unit to the three-phase phase lines, the voltage detection unit being configured to measure voltage of the three-phase phase lines and to output measurement to a control unit.

12 Claims, 4 Drawing Sheets

(51) Int. Cl.
 *G01R 19/257*        (2006.01)
 *H02P 3/22*          (2006.01)
(58) Field of Classification Search
 CPC ............. G01R 19/25; B66B 5/02; B66B 5/00;
             B66B 5/0037; B66B 1/30; H02P 3/22
 See application file for complete search history.

(56)                References Cited

U.S. PATENT DOCUMENTS

2004/0057171 A1*   3/2004  Mayhew ................... H02H 7/09
                                                   361/23
2005/0185350 A1*   8/2005  Wakefield ............ H02H 7/0816
                                                   361/23
2015/0316585 A1*  11/2015  Forstner ............. G01R 19/0084
                                                   324/126
2022/0300797 A1*   9/2022  Kim ........................ G11C 11/54

FOREIGN PATENT DOCUMENTS

| | | | | |
|---|---|---|---|---|
| CN | 205294529 U | | 6/2016 | |
| CN | 106629298 A | | 5/2017 | |
| CN | 106712644 B | | 2/2019 | |
| CN | 109959878 A | | 7/2019 | |
| CN | 110817624 A | | 2/2020 | |
| CN | 110970866 A | | 4/2020 | |
| CN | 210393363 U | | 4/2020 | |
| CN | 212381142 U | | 1/2021 | |
| CN | 108861902 B | | 4/2022 | |
| CN | 107370175 B | * | 5/2023 | ............. H02J 9/062 |
| CN | 218988507 U | * | 5/2023 | |
| EP | 3418233 A1 | | 12/2018 | |
| EP | 2528226 B1 | | 8/2020 | |
| EP | 4053874 A1 | | 9/2022 | |
| WO | 2019034287 A1 | | 2/2019 | |

* cited by examiner

DEVICE FOR TESTING FUNCTION OF CONTACTORS AND APPARATUS FOR PERFORMING ELEVATOR FUNCTION

FOREIGN PRIORITY

This application claims priority to Chinese Patent Application No. 202310072170.X, filed Jan. 11, 2023, and all the benefits accruing therefrom under 35 U.S.C. § 119, the contents of which in its entirety are herein incorporated by reference.

TECHNICAL FIELD

The present application relates to elevator safety technology, and in particular to a device for detecting a function of a contactor and elevator functionality device comprising the device.

BACKGROUND

FIG. 1 shows a principle of implementing motor star sealing function within an elevator system. As shown in FIG. 1, three-phase outputs of an inverter are connected to an elevator motor M via phase lines U, V and W. A switch SW and contactor SK are connected to the phase lines. When a car stops at a floor, the switch SW is disconnected and the contactor SK's contacts close, making the three phase lines U, V and W of the motor M short to stop the motor from slipping quickly, thus playing a role in safety protection.

To improve reliability, the effectiveness of the contactor function needs to be detected regularly or irregularly. However, to date, the industry has not provided a simple, reliable and low-cost detection scheme to implement the detection of the contactor function.

SUMMARY

According to an aspect of the present application, there is provided a device for detecting a function of a contactor, wherein the contactor is configured to short three-phase phase lines of an elevator motor together by closing contacts, the device comprising: a voltage signal source coupled with the contactor; a voltage detection unit coupled with the three-phase phase lines of the elevator motor: a switching unit arranged between the contactor and the voltage signal source and between the voltage detection unit and the three-phase phase lines, wherein, in a detection mode, the switching unit is configured to conduct the voltage signal source to the contactor to provide a voltage detection signal to the three-phase phase lines via the contactor and to conduct the voltage detection unit to the three-phase phase lines, the voltage detection unit being configured to measure voltage of the three-phase phase lines and to output measurement to a control unit.

Optionally, in the above device, the voltage detection signal is a signal whose amplitude varies with a predetermined period.

Optionally, in the above device, the switching unit is implemented by a contactor whose contacts are closed in the detection mode to conduct the contactor to the voltage signal source and the voltage detection unit to the three-phase phase lines.

In addition to one or more of the above features, in the above device, the voltage detection unit comprises: an integrator configured to integrate the measured voltage signal: an analog-to-digital converter configured to convert the voltage signal as integrated into a corresponding digital signal and to output the digital signal to the control unit as the measurement.

According to another aspect of the present application, there is provided an elevator functionality device comprising: a control unit: a contactor configured to short three-phase phase lines of an elevator motor together by closing contacts: a function detection device comprising: a voltage signal source coupled with the contactor: a voltage detection unit coupled with the three-phase phase lines of the elevator motor, the voltage detection unit being configured to measure voltage of the three-phase phase lines and to output measurement to the control unit: a switching unit arranged between the contactor and the voltage signal source and between the voltage detection unit and the three-phase phase lines, wherein, the control unit is configured to perform the following operations in a detection mode: instructing the contactor to cause the contacts to close, instructing the switching unit to conduct the voltage signal source to the contactor to provide a voltage detection signal to the three-phase phase lines via the contactor and to conduct the voltage detection unit to the three-phase phase lines, and determining whether the function of the contactor is normal based on the measurement.

In addition to one or more of the above features, in the above elevator functionality device, the control unit determines whether the function of the contactor is normal in the following manner: if the measurement deviates from the voltage detection signal in magnitude or waveform beyond a set range, it is determined that the function of the contactor is abnormal.

Further, functional abnormality of the contactor includes the following types: unclosed contact, poor contact of the contact, and incorrect connection of the contact.

According to another aspect of the present application, there is provided a device for detecting a function of a contactor, wherein the contactor is configured to short three-phase phase lines of an elevator motor together by closing contacts, the device comprising: a current signal source coupled with the contactor; a current detection unit comprising a current sensor arranged near the three-phase phase lines of the elevator motor; a switching unit arranged between the contactor and the current signal source and between the current signal source and the three-phase phase lines, wherein, in a detection mode, the switching unit is configured to conduct the current signal source to the contactor to provide a current detection signal to the three-phase phase lines via the contactor and to conduct the current signal source to the three-phase phase lines, the current detection unit being configured to measure current flowing through the three-phase phase lines and to output measurement to a control unit.

Optionally, in the above device, the current detection signal is an AC signal.

Optionally, in the above device, the switching unit is implemented by a contactor whose contacts are closed in the detection mode to conduct the contactor to the current signal source and the current signal source to the three-phase phase lines.

In addition to one or more of the above features, in the above device, the current detection unit further comprises: an analog-to-digital converter configured to convert a current signal measured by the current sensor into a corresponding digital signal and to output the digital signal to the control unit as the measurement.

According to another aspect of the present application, there is provided an elevator functionality device comprising: a control unit: a contactor configured to short three-phase phase lines of an elevator motor together by closing contacts: a function detection device comprising: a current signal source coupled with the contactor; a current detection unit comprising a current sensor arranged near the three-phase phase lines of the elevator motor; a switching unit arranged between the contactor and the current signal source and between the current signal source and the three-phase phase lines, wherein, the control unit is configured to perform the following operations in a detection mode: instructing the contactor to cause the contacts to close, instructing the switching unit to conduct the current signal source to the contactor to provide a current detection signal to the three-phase phase lines via the contactor and to conduct the current signal source to the three-phase phase lines, and determining whether the function of the contactor is normal based on a current signal measured by the current sensor.

In addition to one or more of the above features, in the above elevator functionality device, the control unit determines whether the function of the contactor is normal in the following manner: if the measurement deviates from the current detection signal in magnitude or waveform beyond a set range, it is determined that the function of the contactor is abnormal.

DESCRIPTION OF THE DRAWINGS

The above and/or other aspects and advantages of the present application will be clearer and more easily understood from the following description of various aspects in conjunction with the accompanying drawings, in which the same or similar elements are denoted by the same reference numerals. The accompanying drawings include.

DETAILED DESCRIPTION

The present application is described more fully below with reference to the accompanying drawings, in which illustrative embodiments of the application are illustrated. However, the present application may be implemented in different forms and should not be construed as limited to the embodiments presented herein. The presented embodiments are intended to make the disclosure herein comprehensive and complete, so as to more comprehensively convey the protection scope of the application to those skilled in the art.

In this specification, terms such as "comprising" and "including" mean that in addition to units and steps that are directly and clearly stated in the specification and claims, the technical solution of the application does not exclude the presence of other units and steps that are not directly and clearly stated in the specification and claims.

Unless otherwise specified, terms such as "first" and "second" do not indicate the order of the units in terms of time, space, size, etc., but are merely used to distinguish the units.

Figure 1:
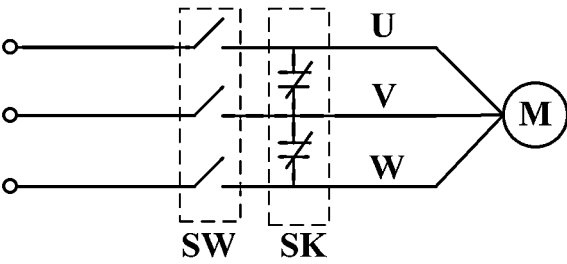
FIG. 1 shows a principle of implementing motor star sealing function within an elevator system.
Figure 2:
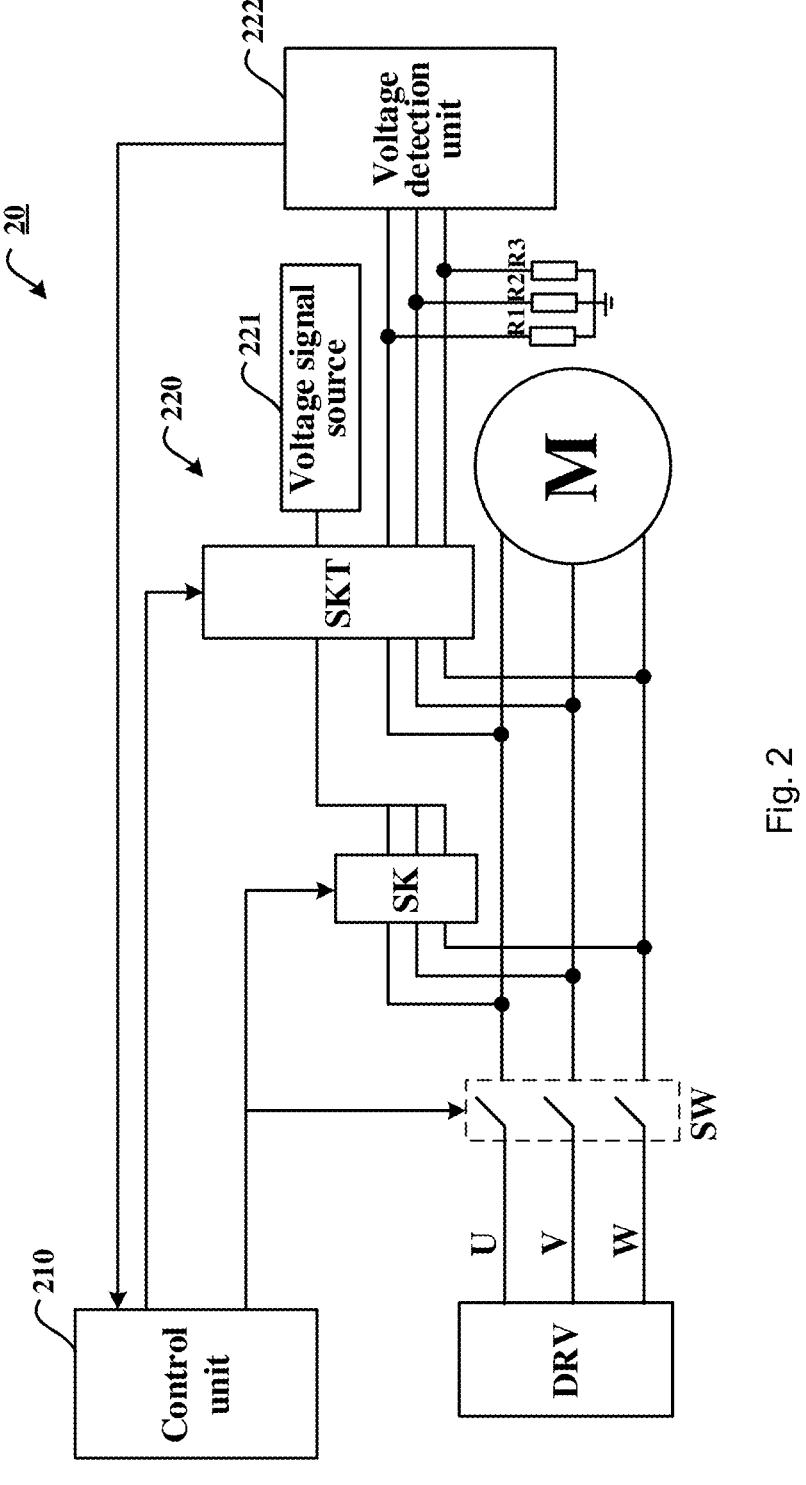
FIG. 2 is a schematic diagram of an elevator functionality device in accordance with some embodiments of the present application.

FIG. 2 is a schematic diagram of an elevator functionality device in accordance with some embodiments of the present application.

A device 20 shown in FIG. 2 includes a control unit 210, a switch SW, a contactor SK, and a function detection device 220.

Referring to FIG. 2, a driver DRV (e.g., a motor drive circuit) is coupled with an elevator motor M via three-phase phase lines U, V and W. The switch SW and the contactor SK are connected to the three-phase phase lines U, V and W. The on-off status of the switch SW and the contactor SK is controlled by the control unit 210. The control unit 210 may be implemented using a controller such as a processor-based controller programed to carry out the operations described herein.

In the elevator functionality device shown in FIG. 2, the function detection device 220 is used to detect whether a function of the contactor SK is normal. Referring to FIG. 2, the function detection device 220 includes a voltage signal source 221 coupled with the contactor SK, a voltage detection unit 222 coupled with the three-phase phase lines U, V, and W, and a contactor SKT (also referred to as a switching unit). As shown in FIG. 2, the contactor SKT is arranged between the contactor SK and the voltage signal source 221 and between the voltage detection unit 222 and the phase lines U, V, and W. In addition, resistors R1, R2 and R3 are connected between an input of the respective corresponding voltage detection unit 222 and ground. It should be noted that the contactor SKT here is only exemplary, and in other embodiments, other types of switching elements may be used instead of the contactor SKT.

The elevator functionality device 20 shown in FIG. 2 may be operated in both normal mode and detection mode. When operating in the normal mode, under the control of the control unit 210, the switch SW is open and the contacts of the contactor SK are closed, thus shorting the three-phase phase lines U, V and W to generate a counter-electromotive force in the coil of the motor M that prevents the motor from rotating: at the same time, under the control of the control unit 210, the contacts of the contactor SKT are open, causing the function detection device 220 to disconnect from the contactor SK and the three-phase phase lines U, V and W.

The function detection device 220 operates only in the detection mode, and the operating principle of the device is described below.

When operating in the detection mode, the control unit 210 sends a command to enter an open status to the switch SW and a command to close the contacts to the contactor SK: at the same time, the control unit 210 also sends a command to close the contacts to the contactor SKT, which causes the voltage signal source 221 to conduct with the contactor SK and the voltage detection unit 222 to conduct with the three-phase phase lines U, V and W.

In the detection mode, if the function of the contactor SK is normal (the contacts may be closed), a voltage detection signal generated by the voltage signal source 221 is applied to the three-phase phase lines U, V and W via the contactor SK. Since the voltage detection unit 222 is conducted to the three-phase phase lines U, V and W, the measured voltage signal is the same or similar to the voltage detection signal in terms of amplitude or waveform. In other words, the deviation between the measured voltage signal and the voltage detection signal in terms of amplitude or waveform will not exceed a set range.

In the detection mode, if the contacts of the contactor SK fail to close, this will result in the voltage detection signal Vt generated by the voltage signal source 221 no longer being able to be applied to the three-phase phase lines U, V and W, but instead generating an induced voltage within the windings of the motor M. Exemplarily, assuming that the contact of the contactor SK connected to the phase line V cannot be closed, the voltage signal on the phase line V measured by the voltage detection unit 222 will be significantly different from the voltage detection signal in terms of amplitude or waveform.

In addition, in the detection mode, if the contacts of the contactor SK are in poor contact (for example, assuming that the contact of the contactor SK connected to the phase line U is in poor contact), it is equivalent to connecting a resistor in series with the phase line U. This will cause the voltage detection signal generated by the voltage signal source 221 to have a voltage drop on the phase line U. Therefore, the voltage signal on the phase line U measured by the voltage detection unit 222 will also be significantly different from the voltage detection signal in terms of amplitude or waveform.

Referring to FIG. 2, the voltage detection unit 222 is coupled with the control unit 210 to output the voltage measurement to the control unit 210. Accordingly, the control unit 210 may determine whether the function of the contactor SK is normal based on the measurement. For example, the control unit 210 may determine whether the function of the contactor SK is normal in the following manner: if the measurement deviates from the voltage detection signal in magnitude or waveform beyond a set range, it is determined that the function of the contactor is abnormal.

Figure 3:
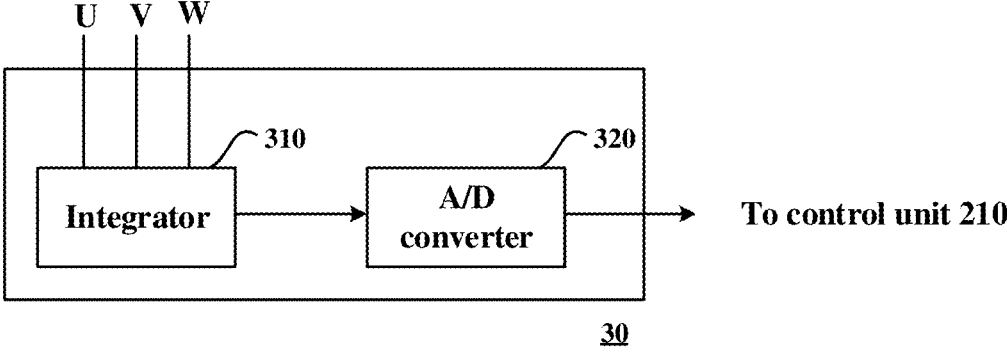
FIG. 3 is a schematic diagram of a voltage detection unit that may be applied to the embodiments shown in FIG. 2.

FIG. 3 is a schematic diagram of a voltage detection unit that may be applied to the embodiments shown in FIG. 2. Referring to FIG. 3, a voltage detection unit 30 comprises an integrator 310 and an analog-to-digital converter 320. The integrator 310 is connected to the three-phase phase lines U, V and W via the contactor SKT. When the contacts of the contactor SKT are closed, the voltage signal on the three-phase phase lines U, V and W is input to the integrator 310 for integration. The analog-to-digital converter 320 converts the integrated voltage signal generated by the integrator 310 into a corresponding digital signal and outputs this digital signal to the control unit 210 as the measurement.

In some embodiments, the voltage detection signal is a signal whose amplitude varies with a predetermined period, such as square wave, triangle wave and sine wave.

Figure 4:
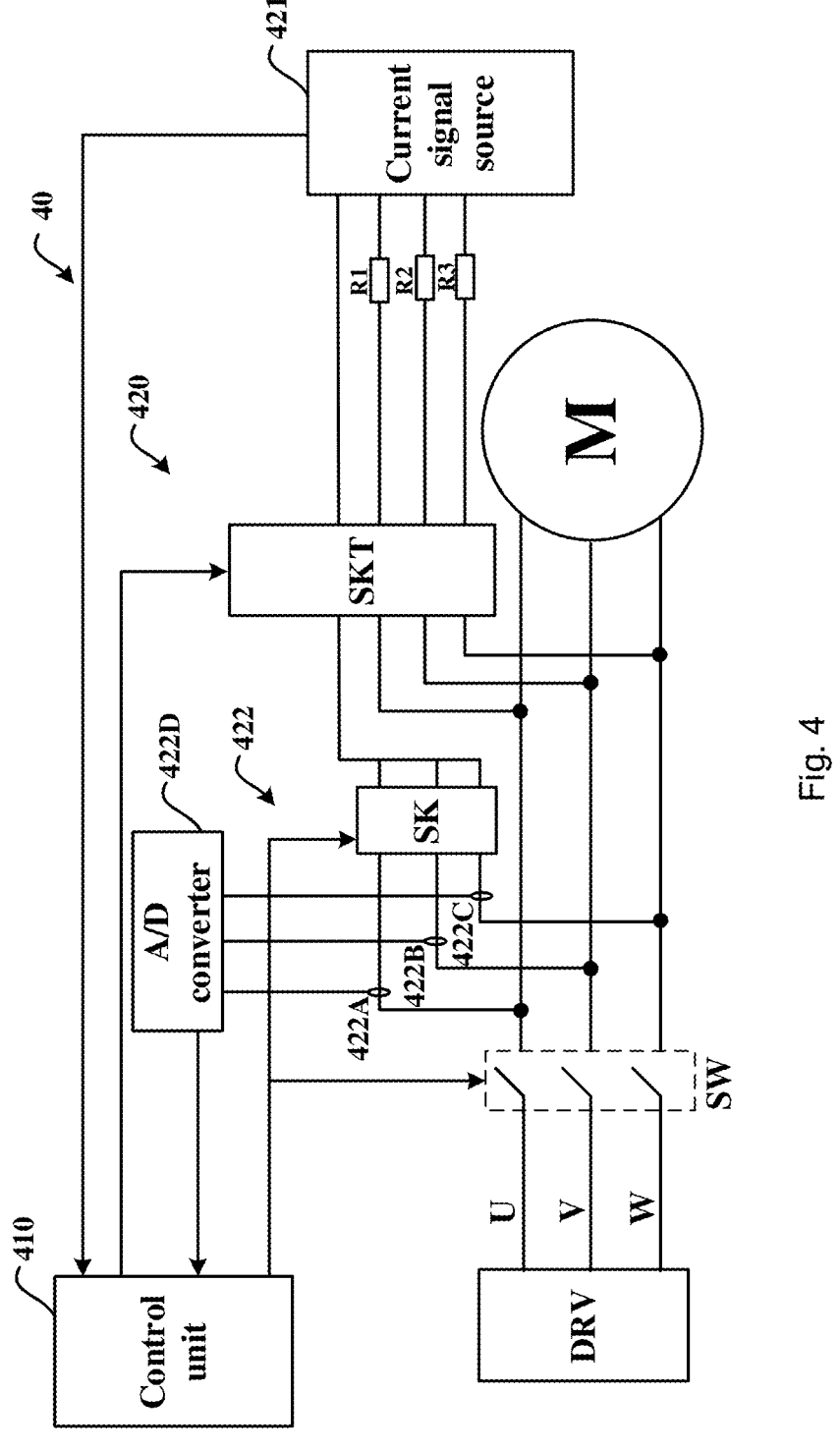
FIG. 4 is a schematic diagram of an elevator functionality device in accordance with some embodiments of the present application.

FIG. 4 is a schematic diagram of an elevator functionality device in accordance with some embodiments of the present application.

A device 40 shown in FIG. 4 includes a control unit 410, a switch SW, a contactor SK and a function detection device 420. Referring to FIG. 4, a driver DRV is coupled with an elevator motor M via three-phase phase lines U, V and W. The switch SW and the contactor SK are connected to the three-phase phase lines U, V and W and their on-off status is controlled by the control unit 410. The control unit 410 may be implemented using a controller such as a processor-based controller programed to carry out the operations described herein.

Referring further to FIG. 4, the function detection device 420 includes a current signal source 421 coupled with the contactor SK, a current detection unit 422, and a contactor SKT. The current signal source 421 may be, for example, an AC current source. As shown in FIG. 4, the current detection unit 422 comprises current sensors 422A, 422B, 422C, and an analog-to-digital converter 422D. The current sensors 422A, 422B, 422C are arranged near the three-phase phase lines U, V, and W to measure the current flowing through the respective corresponding phase lines U, V, and W, respectively. As shown in FIG. 4, the contactor SKT is arranged between the contactor SK and the current signal source 421, and the current signal source 421 is connected to phase lines U, V and W via the contactor SKT and resistors R1, R2 and R3. It should be noted that the contactor SKT here is only exemplary, and in other embodiments, other types of switching elements may be used instead of the contactor SKT.

The elevator functionality device 40 shown in FIG. 4 may be operated in both normal mode and detection mode. When operating in the normal mode, under the control of the control unit 410, the switch SW is open and the contacts of the contactor SK are closed, thus shorting the three-phase phase lines U, V and W. At the same time, the contacts of the contactor SKT are open, causing the function detection device 420 to isolate from the contactor SK and the three-phase phase lines U, V and W.

The function detection device 420 operates only in the detection mode, and the operating principle of the device is described below.

When operating in the detection mode, the control unit 410 sends a command to enter an open status to the switch SW and a command to close the contacts to the contactor SK: at the same time, the control unit 410 also sends a command to close the contacts to the contactor SKT, which causes the current signal source 421 to conduct with the contactor.

In the detection mode, if the function of the contactor SK is normal (the contacts can be closed), a current detection signal It generated by the current signal source 421 flows through the contactor SK to the three-phase phase lines U, V and W. Therefore, the current sensors 422A, 422B and 422C will measure the current signals Iu, Iv and Iw flowing through the respective corresponding phase lines U, V and W. The deviation between the measured current signals and the current detection signal in terms of amplitude or waveform is within a set range.

In the detection mode, if the contacts of the contactor SK fail to close, this will result in the current detection signal generated by the current signal source 421 no longer flowing into the corresponding phase line. For example, when the contactor SK's contact connected to the phase line W fails to close, no more current flows through the phase line W. Therefore, the current sensor 422C measures a current value of 0, although the current sensors 422A and 422B still measure the current flowing through the phase lines U and V.

In addition, in the detection mode, if the contacts of the contactor SK are in poor contact (for example, assuming that the contact of the contactor SK connected to the phase line U is in poor contact), it is equivalent to connecting a resistor in series with the phase line U. This will cause the current signal measured by the current sensor 422A flowing through the phase line U being significantly different from the current detection signal in terms of amplitude or waveform.

Referring to FIG. 4, the analog-to-digital converter 422D of the current detection unit 422 is connected to the current sensors 422A, 422B and 422C and the control unit 410, which converts the current signals measured by the sensors into corresponding digital signals and outputs the digital signals to the control unit 410 as the measurement.

Accordingly, the control unit 410 may determine whether the function of the contactor SK is normal based on the measurement. For example, the control unit 410 may determine whether the function of the contactor SK is normal in the following manner: if the measurement deviates from the current detection signal in magnitude or waveform beyond a set range, it is determined that the function of the contactor SK is abnormal.

Those skilled in the art will appreciate that the various illustrative logical blocks, modules, circuits, and algorithm steps described herein may be implemented as electronic hardware, computer software, or combinations of both.

To demonstrate this interchangeability between hardware and software, various illustrative components, blocks, modules, circuits, and steps have been described above generally in terms of their functionality. Whether such functionality is implemented in hardware or software depends on the particular application and design constraints imposed on the overall system. Those skilled in the art may implement the described functionality in changing ways for the particular application. However, such implementation decisions should not be interpreted as causing a departure from the scope of the present application.

Although only a few of the specific embodiments of the present application have been described, those skilled in the art will recognize that the present application may be embodied in many other forms without departing from the spirit and scope thereof. Accordingly, the examples and implementations shown are to be regarded as illustrative and not restrictive, and various modifications and substitutions may be covered by the application without departing from the spirit and scope of the application as defined by the appended claims.

The embodiments and examples presented herein are provided to best illustrate embodiments in accordance with the present technology and its particular application, and to thereby enable those skilled in the art to implement and use the present application. However, those skilled in the art will appreciate that the above description and examples are provided for convenience of illustration and example only. The presented description is not intended to cover every aspect of the application or to limit the application to the precise form disclosed.

What is claimed is:

1. An elevator functionality device comprising:
   a control unit;
   a contactor configured to short three-phase phase lines of an elevator motor together by closing contacts;
   a motor drive circuit coupled to an elevator motor and configured to power the elevator motor;
   a function detection device comprising:
      a voltage signal source coupled with the contactor, the voltage signal source supplying voltage separate from voltage supplied by the motor drive circuit;
      a voltage detection unit coupled with the three-phase phase lines of the elevator motor, the voltage detection unit being configured to measure voltage of the three-phase phase lines and to output measurement to the control unit;
      a switching unit arranged between the contactor and the voltage signal source and between the voltage detection unit and the three-phase phase lines,
   wherein, the control unit is configured to perform the following operations in a detection mode: instructing the contactor to cause the contacts to close, instructing the switching unit to conduct the voltage signal source to the contactor to provide a voltage detection signal to the three-phase phase lines via the contactor and to conduct the voltage detection unit to the three-phase phase lines, and determining whether a function of the contactor is normal based on the measurement.

2. The elevator functionality device of claim 1, wherein the voltage detection signal is a signal whose amplitude varies with a predetermined period.

3. The elevator functionality device of claim 1, wherein the switching unit is implemented by a contactor whose contacts are closed in the detection mode to conduct the contactor to the voltage signal source and the voltage detection unit to the three-phase phase lines.

4. The elevator functionality device of claim 1, wherein the voltage detection unit comprises:
   an integrator configured to integrate the measured voltage signal;
   an analog-to-digital converter configured to convert the voltage signal as integrated into a corresponding digital signal and to output the digital signal to the control unit as the measurement.

5. The elevator functionality device of claim 1, wherein the control unit determines whether the function of the contactor is normal in the following manner: if the measurement deviates from the voltage detection signal in magnitude or waveform beyond a set range, it is determined that the function of the contactor is abnormal.

6. The elevator functionality device of claim 5, wherein functional abnormality of the contactor includes the following types: unclosed contact, poor contact of the contact, and incorrect connection of the contact.

7. An elevator functionality device comprising:
   a control unit;
   a contactor configured to short three-phase phase lines of an elevator motor together by closing contacts;
   a motor drive circuit coupled to an elevator motor and configured to power the elevator motor;
   a function detection device comprising:
      a current signal source coupled with the contactor, the current signal source supplying current separate from current supplied by the motor drive circuit;
      a current detection unit comprising a current sensor arranged near the three-phase phase lines of the elevator motor;
      a switching unit arranged between the contactor and the current signal source and between the current signal source and the three-phase phase lines,
   wherein, the control unit is configured to perform the following operations in a detection mode: instructing the contactor to cause the contacts to close, instructing the switching unit to conduct the current signal source to the contactor to provide a current detection signal to the three-phase phase lines via the contactor and to conduct the current signal source to the three-phase phase lines, and determining whether a function of the contactor is normal based on a current signal measured by the current sensor.

8. The elevator functionality device of claim 7, wherein the current detection signal is an AC signal.

9. The elevator functionality device of claim 7, wherein the switching unit is implemented by a contactor whose contacts are closed in the detection mode to conduct the contactor to the current signal source and the current signal source to the three-phase phase lines.

10. The elevator functionality device of claim 7, wherein the current detection unit further comprises: an analog-to-digital converter configured to convert a current signal measured by the current sensor into a corresponding digital signal and to output the digital signal to the control unit as the measurement.

11. The elevator functionality device of claim 7, wherein the control unit determines whether the function of the contactor is normal in the following manner: if the measurement deviates from the current detection signal in magnitude or waveform beyond a set range, it is determined that the function of the contactor is abnormal.

12. The elevator functionality device of claim 11, wherein functional abnormality of the contactor includes the following types: unclosed contact, poor contact of the contact, and incorrect connection of the contact.

\*  \*  \*  \*  \*